United States Patent
Khemka et al.

(10) Patent No.: US 7,723,204 B2
(45) Date of Patent: May 25, 2010

(54) SEMICONDUCTOR DEVICE WITH A MULTI-PLATE ISOLATION STRUCTURE

(75) Inventors: Vishnu K. Khemka, Chandler, AZ (US); Amitava Bose, Tempe, AZ (US); Todd C. Roggenbauer, Chandler, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 923 days.

(21) Appl. No.: 11/390,918

(22) Filed: Mar. 27, 2006

(65) Prior Publication Data

US 2007/0224738 A1  Sep. 27, 2007

(51) Int. Cl.
*H01L 21/76* (2006.01)
(52) U.S. Cl. ............... 438/430; 438/454; 257/E21.572
(58) Field of Classification Search ............... 438/430, 438/454; 257/339, 508, E21.572, 488
See application file for complete search history.

(56) References Cited

U.S. PATENT DOCUMENTS

| | | | | |
|---|---|---|---|---|
| 5,700,712 | A * | 12/1997 | Schwalke ............... | 438/430 |
| 5,705,415 | A * | 1/1998 | Orlowski et al. ............ | 438/259 |
| 5,889,314 | A * | 3/1999 | Hirabayashi ............... | 257/508 |
| 6,177,317 | B1 * | 1/2001 | Huang et al. ............... | 438/263 |
| 6,734,524 | B1 | 5/2004 | Parthasarathy et al. | |
| 6,833,583 | B2 * | 12/2004 | In't Zandt et al. ........... | 257/329 |
| 2002/0098642 | A1 | 7/2002 | Harris et al. | |
| 2004/0161931 | A1 | 8/2004 | Parthasarathy et al. | |
| 2007/0241373 | A1 * | 10/2007 | Kuroi et al. .................. | 257/288 |
| 2007/0275514 | A1 * | 11/2007 | Itou ........................... | 438/151 |
| 2008/0283960 | A1 * | 11/2008 | Lerner ........................ | 257/508 |

OTHER PUBLICATIONS

Ayazi, F., et al., High Aspect-Ratio Polysilicon Micromaching Technology, 10th International Conference on Solid State Sensors and Actuators, Transducers '99, Jun. 1999.
International Search Report and Written Opinion.

* cited by examiner

*Primary Examiner*—Mary Wilczewski
*Assistant Examiner*—Toniae M Thomas
(74) *Attorney, Agent, or Firm*—Ingrassia, Fisher & Lorenz, P.C.

(57) ABSTRACT

A microelectronic assembly and a method for constructing a microelectronic assembly are provided. The microelectronic assembly may include a semiconductor substrate with an isolation trench (62) formed therein. The isolation trench (62) may have first and second opposing inner walls (74, 76) and a floor (78). First and second conductive plates (106) may be formed over the first and second opposing inner walls (74, 76) of the isolation trench (62) respectively such that there is a gap (90) between the first and second conductive plates (106). First and second semiconductor devices (114) may be formed in the semiconductor substrate on opposing sides of the isolation trench (62). The method may include forming a trench (62) in a semiconductor substrate, forming first and second conductive plates (106) within the trench, and forming first and second semiconductor devices (114) in the semiconductor substrate on opposing sides of the trench (62).

12 Claims, 5 Drawing Sheets

SEMICONDUCTOR DEVICE WITH A MULTI-PLATE ISOLATION STRUCTURE

FIELD OF THE INVENTION

The present invention generally relates to a semiconductor device and a method for forming a semiconductor device, and more particularly relates to a high power transistor.

BACKGROUND OF THE INVENTION

Integrated circuits are formed on semiconductor substrates, or wafers. The wafers are then sawed into microelectronic dies (or "dice"), or semiconductor chips, with each die carrying a respective integrated circuit. Each semiconductor chip is mounted to a package, or carrier substrate, which is often mounted to a motherboard and installed in various electronic systems.

In power integrated circuits, several semiconductor devices with voltage handling capability ranging from low to very high are integrated together. The devices with different characteristics and performance ratings need to be isolated from each other in order to prevent any cross-talk leading to malfunction in circuit operation. Thus, device-to-device isolation voltage capability, or "breakdown voltage," is an important parameter in power integrated circuits. Traditional power integrated circuit technologies have commonly utilized a junction based isolation scheme which can give a desired isolation voltage, however, at the cost of increased device size.

One of the methods that has been attempted to improve breakdown voltage involves the formation of isolation trenches between the individual semiconductor devices (e.g., transistors). A single, floating conductor has been formed within the isolation trenches and surrounded by an insulating material, such as silicon dioxide. However, in such a configuration, if the voltage requirement is high, the thickness of the oxide around the conductor often becomes too great which, because of the differences in the coefficients of thermal expansion of the oxide and silicon, leads to severe mechanical stresses within the trenches and on the devices themselves. Such stresses can adversely affect the reliability of the devices.

Accordingly, it is desirable to provide a microelectronic assembly with an improved breakdown voltage between individual semiconductor devices. In addition, it is desirable to reduce the mechanical stresses experienced by the semiconductor devices. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-12 are merely illustrative and may not be drawn to scale.

Figure 1:
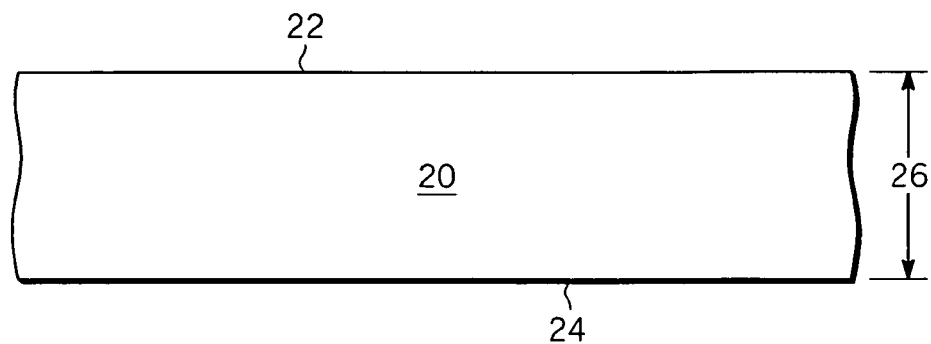
FIG. 1 is a cross-sectional side view of a semiconductor substrate.

FIGS. 1-12 illustrate a method for forming a microelectronic assembly, according to one embodiment of the present invention. Referring to FIG. 1, there is illustrated a semiconductor substrate 20 comprising a semiconductor material, such as gallium arsenide (GaAs), gallium nitride (GaN), or silicon (Si). The substrate 20 has an upper surface 22, a lower surface 24, and a thickness 26, for example, between approximately 300 and 1000 microns. The semiconductor material of the substrate 20 may be of a first conductivity type, or doped with a first dopant type, as is commonly understood in the art. In the example illustrated in FIG. 1, the substrate 20 is a "P-type" semiconductor substrate and is doped with boron (B) to a concentration of, for example, approximately $1.0 \times 10^{15}$ atoms per cm$^3$.

Although only a portion of the semiconductor substrate is illustrated, it should be understood that the substrate 20 may be a semiconductor wafer with a diameter of, for example, approximately 150, 200, or 300 millimeters. Additionally, although not specifically illustrated, the substrate 20 may be divided into multiplies dies, or "dice," as commonly understood in the art. Furthermore, although the following process steps may be shown as being performed on only a small portion of the substrate 20, it should be understood that each of the steps may be performed on substantially the entire substrate 20, or multiple dice, simultaneously. Furthermore, although not shown, it should be understood that the processing steps described below may be facilitated by the deposition and removal of multiple additional processing layers, such as photoresist layers, as is commonly understood.

Figure 2:
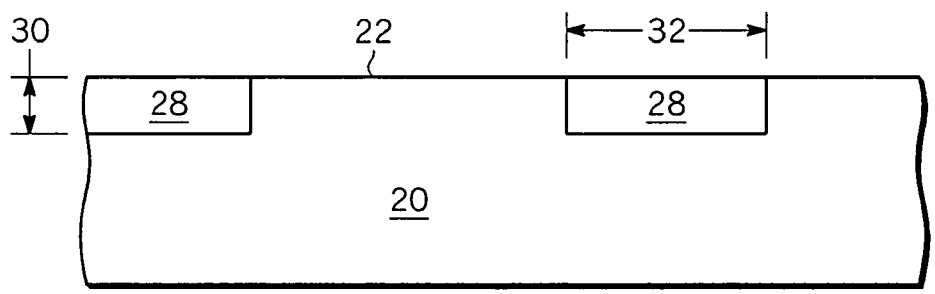
FIG. 2 is a cross-sectional side view of the semiconductor substrate of FIG. 1 with a plurality of buried layers formed in an upper surface thereof.

As illustrated in FIG. 2, a plurality of buried layers or sections 28 are first formed in the upper surface 22 of the substrate 20. In one embodiment, the buried layers 28 are formed using ion implantation and have a thickness 30 of, for example, between approximately 1 and 2 microns and a width 32 of, for example, between 4 and 5 microns. The ion implantation process changes the semiconductor material of the substrate 20 within the buried layers 28 to a second conductivity type (i.e., via a second dopant type), as is commonly understood. In one embodiment, the buried layers 28 includes "N-type" semiconductor material doped with a relatively high concentration of antimony (Sb) of approximately $1.0 \times 10^{19}$ atoms per cm$^3$.

Figure 3:
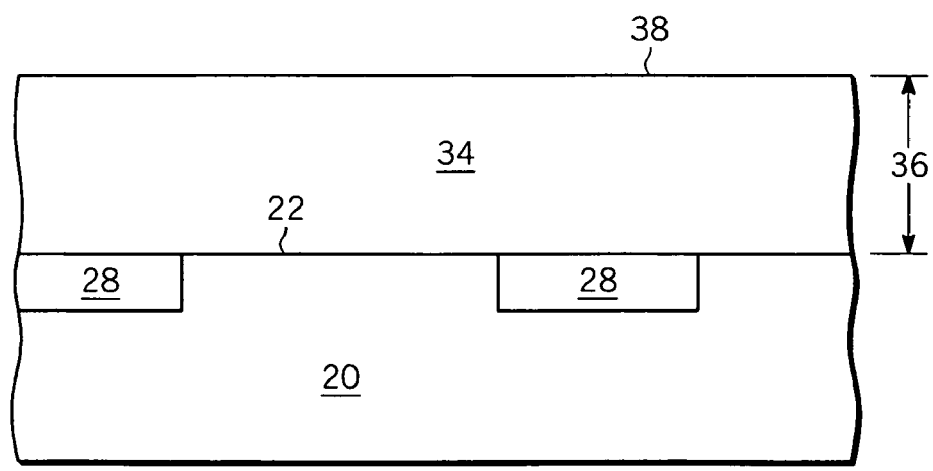
FIG. 3 is a cross-sectional side view of the semiconductor substrate of FIG. 2 with an epitaxial layer formed thereon.

As shown in FIG. 3, an epitaxial layer 34 is then formed, or grown, on the upper surface 22 of the substrate 20 and over the buried layers 28. The epitaxial layer 34 may have a thickness 36 of, for example, between 2 and 5 microns, and the semiconductor material of the epitaxial layer 34 may have the first conductivity type (i.e., P-type). In one embodiment, the epitaxial layer 34 is doped with boron to a concentration of, for example, approximately $1.0 \times 10^{15}$ atoms per cm$^3$. The epitaxial layer 34 may also have an upper surface 38.

Figure 4:
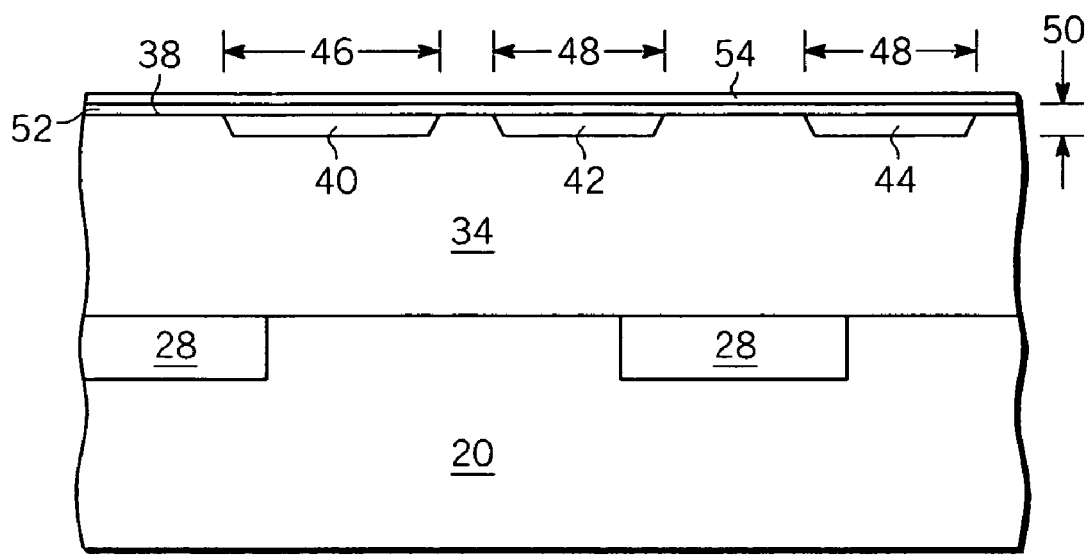
FIG. 4 is a cross-sectional side view of the semiconductor substrate of FIG. 3 with a plurality of isolation regions and processing layers formed thereon.

Referring to FIG. 4, first, second, and third shallow trench isolation (STI) regions 40, 42, and 44 are then formed on, or in, the upper surface 38 of the epitaxial layer 34. As is commonly understood in the art, the first, second, and third STI regions 40, 42, and 44 may be formed by etching trenches into the upper surface 38 of the epitaxial layer 34 and filling the trenches with an insulating material, such as silicon dioxide. The first STI region 40 may have a width 46 of, for example, between 3 and 8 microns, and the second and third STI regions 42 and 44 may each have a width 48 of, for example, between 2 and 5 microns. The STI regions 40, 42 and 44 may each have a thickness 50 of, for example, between 0.3 and 1 micron.

Figure 5:
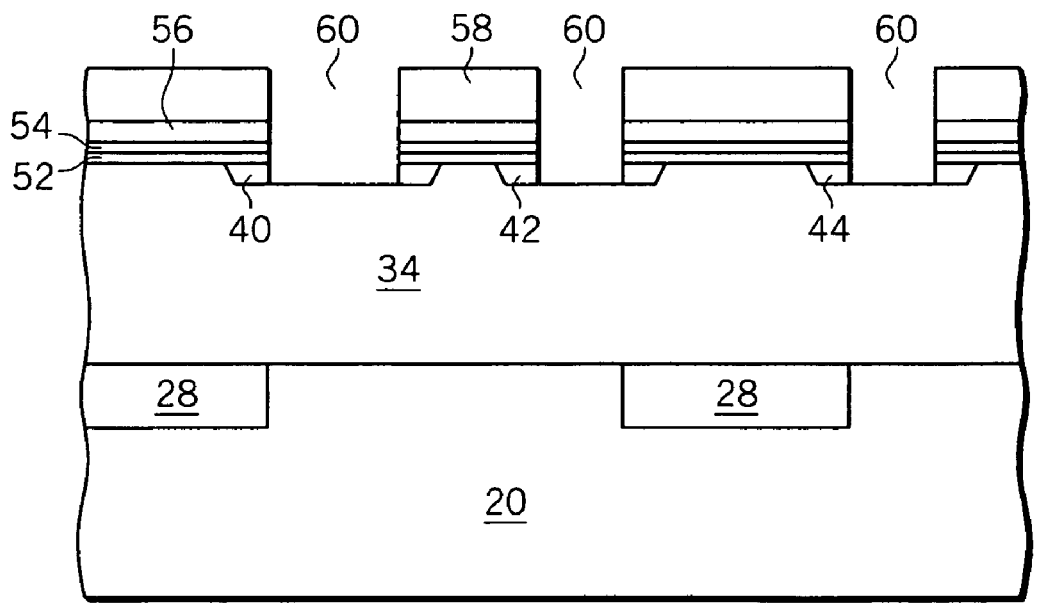
FIG. 5 is a cross-sectional side view of the semiconductor substrate of FIG. 4 with additional processing layers formed thereon and openings formed therethrough into the isolation regions.

As shown in FIGS. 4 and 5, additional processing layers, such as an oxide layer 52, a nitride layer 54, a hardmask layer 56, and a photoresist layer 58 may be formed over the upper surface 38 of the epitaxial layer 34 to facilitate the other processing steps, as is commonly understood. Referring specifically to FIG. 5, openings 60 may then be etched through the photoresist layer 58, the hardmask layer 56, the nitride layer 54, and the oxide layer 52 and through the STI regions 40, 42, and 44 to expose the epitaxial layer 34 below the STI regions 40, 42, and 44.

Figure 6:
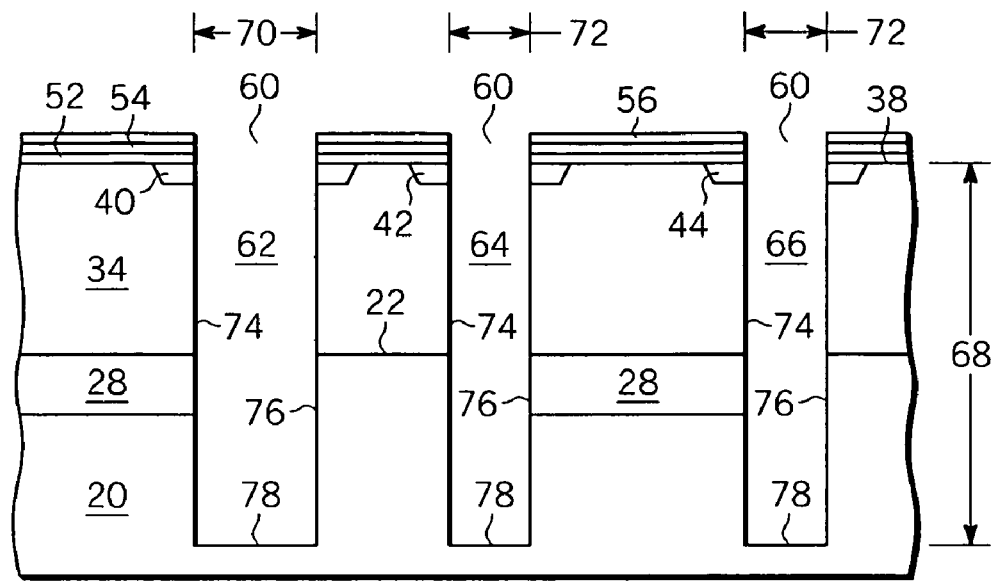
FIG. 6 is a cross-sectional side view of the semiconductor substrate of FIG. 5 with trenches formed through the isolation regions and the epitaxial layer into the semiconductor substrate.

Referring to FIG. 6, after the photoresist layer 58 is removed, first, second, and third deep trenches 62, 64, and 66 are then formed within the openings 60 through the epitaxial layer 34 and into the upper surface of the substrate 20. The deep trenches 62, 64, and 66 each have a depth of, for example, between 6 and 12 microns. As illustrated, the depth 68 of the trenches 62, 64, and 66 may be greater, as measured from the upper surface 38 of the epitaxial layer 34, than the depth of the buried layers 28. Thus, the trenches 62, 64, and 66 extend downward past the buried layers 28. The first trench 62 has a width 70 of, for example, between 2 and 4 microns, and the second and third trenches 64 and 66 each have a width 72 of, for example, between 1 and 2 microns. Each of the trenches 62, 64, and 66 has first and second opposing inner walls 74 and 76 and a floor 78. As shown, one of the inner walls 74 and 76 may be adjacent to one of the buried layers 28. The trenches 62, 64 and 66 may be formed using, for example, Reactive Ion Etching (RIE).

Figure 7:
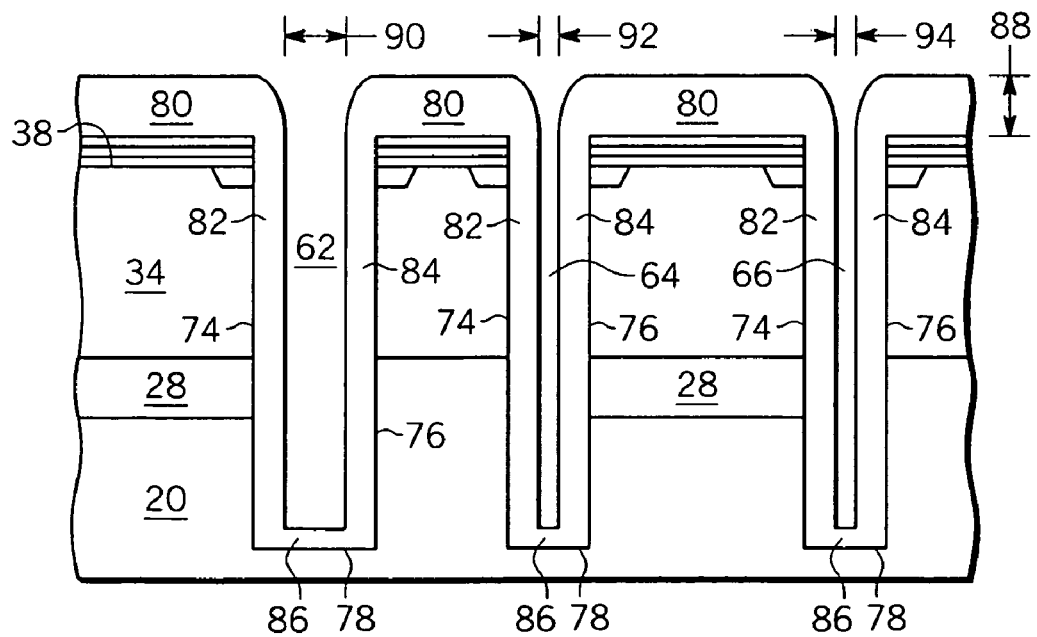
FIG. 7 is a cross-sectional side view of the semiconductor substrate of FIG. 6 with an insulating layer formed over an upper surface thereof and within the trenches.

Next, an insulating layer 80 is formed over the remaining insulating layer 56 and within the trenches 62, 64, and 66, as shown in FIG. 7. The insulating layer 80 has first, second, and third portions 82, 84 and 86 over the first and second opposing inner walls 74 and 76 and the floor 78, respectively, of each of the trenches 62, 64, and 66, and a thickness 88 of, for example, between 0.5 and 1 microns. As shown, the combined thicknesses of the first and second portions 82 and 84 of the insulating layer 80 over the first and second opposing inner walls 74 and 76 of the trenches 62, 64, and 66 are less than the widths 70 and 72 illustrated in FIG. 6. Therefore, first, second, and third gaps 90, 92, and 94 are formed within the first, second, and third trenches 62, 64, and 66 respectively between the first and second portions 82 and 84 of the insulating layer 80 of each trench. The first gap 90 within the first trench 62 may span a distance of, for example, between 1 and 3 microns, and the second and third gaps 92 and 94 within the second and third trenches 92 and 94 may span distance of, for example, between 0.5 and 2 microns. The insulating layer 80 may be an oxide, such as tetraethyloxysilicate (TEOS), or a low-K or a high-K oxide, or a nitride and may be formed using, for example, chemical vapor deposition (CVD), as is commonly understood.

Figure 8:
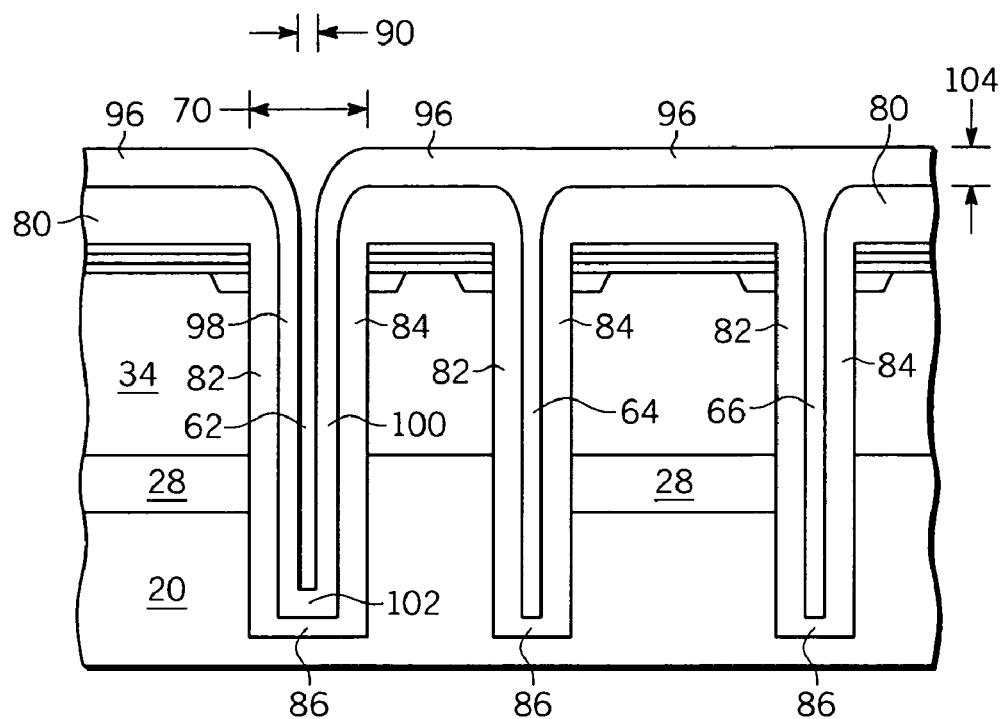
FIG. 8 is a cross-sectional side view of the semiconductor substrate of FIG. 7 with a conductive layer formed over the insulating layer and within the trenches.

As illustrated in FIG. 8, a conductive layer 96 is then formed over the insulating layer 80 and within the trenches 62, 64, and 66. The conductive layer has, at least within the first trench 62, first, second, and third portions 98, 100, 102 over the first, second, and third portions 82, 84, and 86 of the insulating layer 80. The conductive layer 96 has, for example, a thickness of between 0.5 and 1 microns. As shown, the combined thickness of the first and second portions 98 and 100 of the conductive layer 96 over the first and second portions 82 and 84 of the insulating layer 80 within the first trench 62 is less than the distance spanned by the first gap 90. Thus, the first gap 90 remains within the first trench 62, but has been reduced to span a distance of, for example, 0.25 to 0.5 microns, as measured from the first portion 98 of the conductive layer 96 to the second portion 100 of the conductive layer 96. However, the second and third gaps 92 and 94, as shown in FIG. 7, within the trenches 64 and 66 have been completely filled by the conductive layer 96. The conductive layer 96 may be made of a conductive material, such as polycrystalline silicon, or a metal, such as aluminum or tungsten, and may be formed using a CVD process, such as low pressure CVD (LPCVD).

Figure 9:
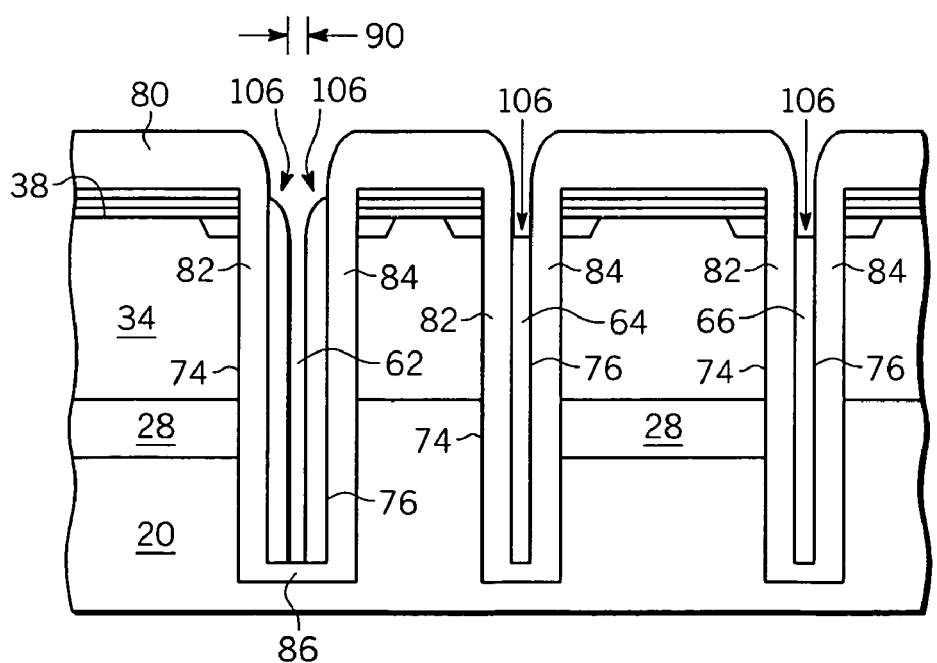
FIG. 9 is a cross-sectional side view of the semiconductor substrate of FIG. 8 after the conductive layer has undergone an etching process to separate the conductive layer into conductive plates.

The conductive layer 96 then undergoes a dry "blanket" etching process as shown in FIG. 9. As will be appreciated by one skilled in the art, a blanket etching process provides an extremely anisotropic etch such that only the portions of the conductive layer 96 that are facing upward are etched. Thus, as shown in FIG. 9, the portions of the conductive layer 96 over the upper surface 38 of the epitaxial layer 34 have been removed, as has the third portion 102 of the conductive layer 96 within the first trench 62. The remaining portions of the conductive layer 96 form conductive plates 106. As illustrated, the first trench 62 includes two conductive plates 106, each of the plates 106 being adjacent to either the first or second portion 82 and 84 of the insulating layer 80 within the first trench 62, with the gap 90 remaining between. The second and third trenches 64 and 66 each include one conductive plate 106 that is adjacent to both the first and second portions 82 and 84 of the insulating layer 80 within the second and third trenches 64 and 66.

Figure 10:
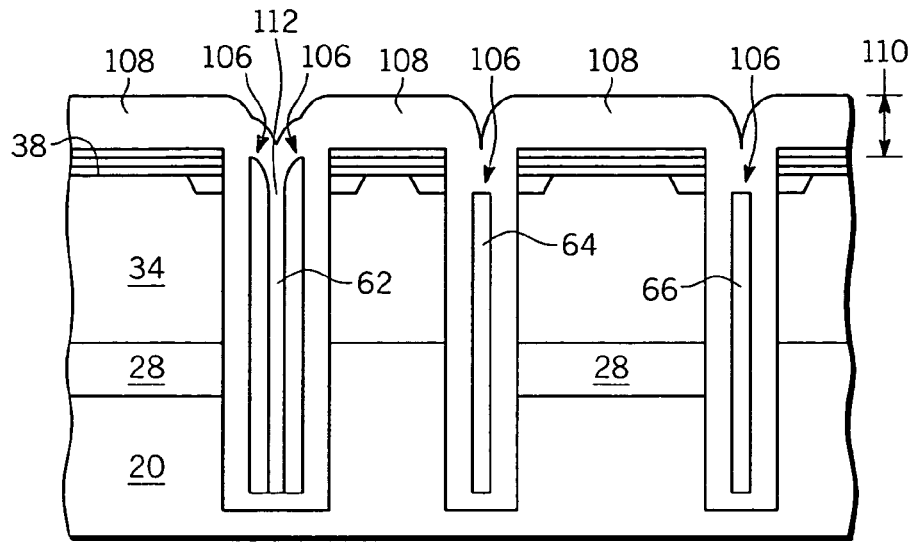
FIG. 10 is a cross-sectional side view of the semiconductor substrate of FIG. 9 with a second insulating layer formed over the upper surface of the substrate and the conductive plates.

Referring to FIG. 10, a second insulating layer 108 is then formed over the upper surface 38 of the epitaxial layer 34 and the trenches 62, 64, and 66. The second insulating layer 108 has a thickness 110 of, for example, between 0.5 and 1 microns and covers upper ends of the conductive plates 106 within the second and third trenches 64 and 66. The second insulating layer 108 also forms an insulating body 112 within the first trench 62 to fill the first gap 90 between the conductive plates 106 within the first trench 62, as well as cover upper ends thereof. As with the insulating layer 80 shown in FIG. 7, the second insulating layer 108 may be an oxide, such as tetraethyloxysilicate (TEOS), or a low-K or a high-K oxide, or a nitride and may be formed using chemical vapor deposition (CVD), as is commonly understood.

Figure 11:
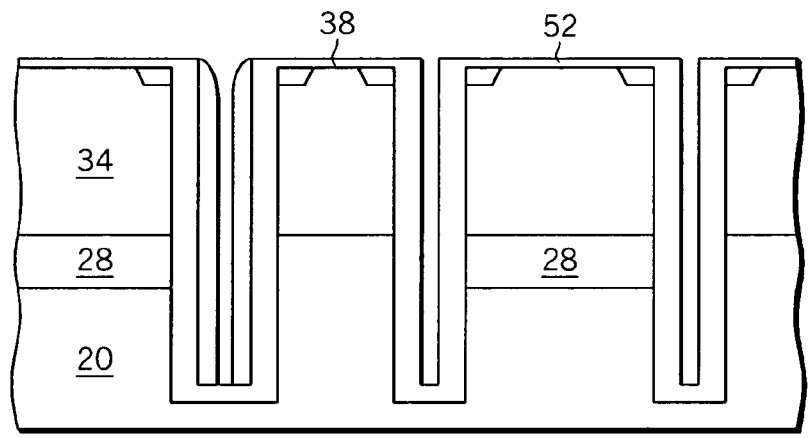
FIG. 11 is a cross-sectional side view of the semiconductor substrate of FIG. 10 after the upper surface of the substrate has undergone an etching and/or a polishing process.
Figure 12:
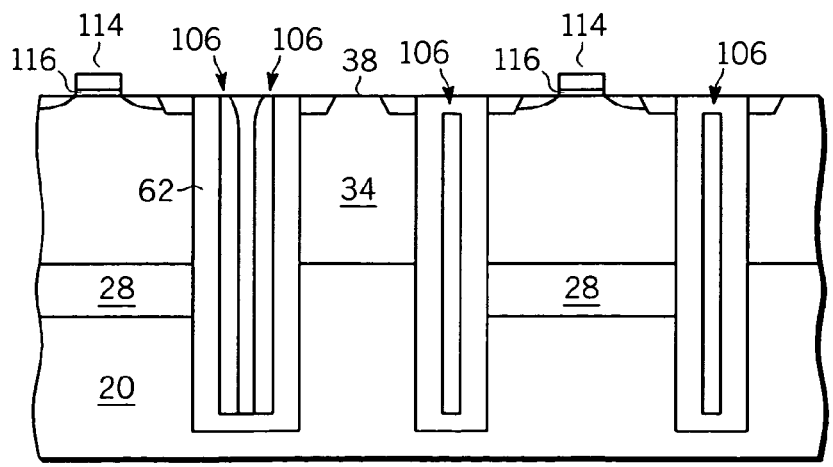
FIG. 12 is a cross-sectional side view of the semiconductor substrate of FIG. 11 with a plurality of semiconductor devices formed in the upper surface thereof.

As shown in FIG. 11, the second insulating layer 108 and the nitride layer 54 are then removed using, for example, a combination of etching and chemical mechanical polishing (CMP) techniques. Referring to FIG. 12, a plurality of semiconductor devices 114 may then be formed in the upper surface 38 of the epitaxial layer 34, and may incorporate gate dielectric 116. The semiconductor devices 114 (e.g., transistors) may be positioned over the buried layers 28 and may include any one of various types of semiconductor devices, such as complimentary metal oxide semiconductor (CMOS) devices, bipolar junction transistors, and other combinational technology devices. Depending on the, particular type of devices 114, the formation of the semiconductor devices 114 may include forming various doped regions, such as sources, drains, wells, and sinkers within the regions of the epitaxial layer 34 between the devices 114 and the buried layers 28. The formation of such devices may substantially complete the formation of a microelectronic assembly, according to one embodiment of the present invention, which includes an Enhanced Lateral and Vertical Isolation Structure (ELVIS), as described above.

After final processing steps, the substrate 20 may be sawed into individual microelectronic dice, or semiconductor chips, packaged, and installed in various electronic or computing systems. Still referring to FIG. 12, although not specifically illustrated electrical connections are made to the semiconductor devices 114 and during operation the two conductive plates 106 within the first trench 62 increases the isolation breakdown voltage between the semiconductor devices 114.

One advantage of the microelectronic assembly described above is that because of the use of multiple conductive plates within a single isolation trench, the breakdown voltage between devices is increased without increasing the overall size of the device. Another advantage is that the multiple conductive plate allows for the use of thinner insulating layers within the trenches, which decreases the mechanical stresses within the isolation trenches.

Other embodiments of the present invention may utilize different numbers of trenches and conductive plates within the trenches. For example, a single trench with multiple conductive plates may be used between semiconductor devices. Additionally, the materials used and the dimensions described may vary, as will be appreciated by one skilled in the art.

One embodiment of the present invention provides a method for constructing a microelectronic assembly. The method may include forming a trench in a semiconductor substrate, forming first and second conductive plates within the trench, and forming first and second semiconductor devices in the semiconductor substrate on opposing sides of the trench.

The trench may have first and second opposing inner walls and a floor. The formation of the first and second conductive plates may include forming a conductive layer within the trench. The conductive layer may have first and second portions over the first and second opposing inner walls of the trench respectively and a third portion over the floor of the trench.

The method may also include removing the third portion of the conductive layer to separate the first and second portions of the conductive layer and form the first and second conductive plates.

The method may also include forming an insulating layer within the trench. The insulating layer may have first and second portions over the first and second opposing inner walls of the trench respectively and a third portion over the floor of the trench. The first, second, and third portions of the conductive layer may be formed over the first, second, and third portions of the insulating layer respectively.

There may be a gap between the first and second portions of the conductive layer. The method may also include forming an insulating body within the trench in the gap between the first and second portions of the conductive layer, the insulating body being adjacent to the first and second portions of the conductive layer.

The trench may have a first width. The method may also include forming a second trench in the semiconductor substrate. The second trench may have first and second opposing inner walls and a floor and a second width that is less than the first width. The method may also include forming a third conductive plate within the second trench.

The method may also include forming an insulating layer within the second trench having first and second portions over the opposing inner walls of the second trench and a third portion over the floor of the second trench such that there is a gap between the first and second portions of the insulating layer within the second trench. The formation of the third conductive plate may include forming a conductive layer within the second trench, the conductive layer being within the gap and adjacent to the first, second, and third portions of the insulating layer within the second trench.

The semiconductor substrate may have a first dopant type. The method may also include forming at least one buried layer within the semiconductor substrate having a second dopant type. The at least one buried layer may be formed at a first depth from an upper surface of the semiconductor substrate. The first and second trenches may have a second depth that is greater than the first depth and be adjacent to the at least one buried layer.

The formations of the respective insulating layers within the trench and the second trench may be performed simultaneously. The formations of the respective conductive layers within the trench and the second trench may be performed simultaneously.

Another embodiment of the present invention provides a method for constructing a microelectronic assembly. A trench may be formed in a semiconductor substrate. The trench may have first and second opposing inner walls and a floor. An insulating layer may be formed within the trench. The insulating layer may have first and second portions over the first and second opposing inner walls of the trench respectively and a third portion over the floor of the trench. A conductive layer may be formed within the trench over the insulating layer. The conductive layer may have first, second, and third portions over the respective first, second, and third portions of the insulating layer. The conductive layer may have a thickness such that a gap lies between the first and second portions thereof. The third portion of the conductive layer may be removed to separate the first and second portions of the conductive layer and form first and second conductive plates. An insulating body may be formed within the trench in the gap between the first and second portions of the conductive layer. First and second semiconductor devices may be formed on opposing sides the trench.

The semiconductor substrate may have a first dopant type. The method may also include forming at least one buried layer within the semiconductor substrate having a second dopant type. The at least one buried layer may be formed at a first depth from an upper surface of the semiconductor substrate. The trench may have a second depth that is greater than the first depth and be adjacent to the at least one buried layer.

The trench may have a first width. The method may also include forming a second trench in the semiconductor substrate and adjacent to the at least one buried layer. The second trench may have first and second opposing inner walls and a floor and a second width that is greater than the first width. The method may also include forming an insulating layer within the second trench having first and second portions over the opposing inner walls of the second trench and a third portion over the floor of the second trench such that there is a gap between the first and second portions of the insulating layer within the second trench. The method may also include forming a conductive layer within the second trench. The second conductive layer may be within the gap and adjacent to the first, second, and third portions of the insulating layer within the second trench to form a third conductive plate within the second trench.

The formations of the respective insulating layers within the trench and the second trench may be performed simultaneously. The formations of the respective conductive layers within the trench and the second trench may be performed simultaneously. The first width may be between approximately 2 and 4 microns, the second width may be between approximately 1 and 2 microns, and the second depth may be between approximately 6 and 12 microns.

A further embodiment of the present invention provides a microelectronic assembly. A semiconductor substrate may have an isolation trench formed therein. The isolation trench may have first and second opposing inner walls and a floor. First and second conductive plates may be formed over the first and second opposing inner walls of the isolation trench respectively such that there is a gap between the first and second conductive plates. First and second semiconductor devices may be formed in the semiconductor substrate on opposing sides of the isolation trench.

The semiconductor substrate may have a first dopant type. The microelectronic assembly may also include a buried layer having a second dopant type below at least one of the semiconductor devices at a first depth from an upper surface of the semiconductor substrate. The trench may be adjacent to the buried layer and have a second depth that is greater than the first depth.

An insulating layer may be formed within the trench having first and second portions over the first and second opposing inner walls of the trench. The first portion of the insulating layer may be between the first inner wall of the trench and the first conductive plate, and the second portion of the insulating layer may be between the second inner wall of the trench and the second conductive plate The trench may have a width of between approximately 2 and 4 microns. The second depth may be between approximately 6 and 12 microns. The insulating layer may have a thickness of between approximately 0.5 and 1 microns. The first and second conductive plates may include at least one of polycrystalline silicon and a metal, and the insulating layer may include at least one of an oxide and a nitride.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for constructing a microelectronic assembly comprising:
   forming a trench in a semiconductor substrate, the trench having first and second opposing inner walls and a floor and a first width;
   forming an insulating layer within the trench, the insulating layer having first and second portions over the first and second opposing inner walls of the trench respectively and a third portion over the floor of the trench;
   forming first and second conductive plates within the trench, the formation of the first and second conductive plates comprising
      forming a conductive layer within the trench, the conductive layer having first and second portions over the first and second opposing inner walls of the trench and the first and second portions of the insulating layer respectively and a third portion over the floor of the trench and the third portion of the insulating layer, and
      removing the third portion of the conductive layer to separate the first and second portions of the conductive layer and form the first and second conductive plates,
   wherein there is a gap between the first and second portions of the conductive layer; and
   forming an insulating body within the trench in the gap between the first and second portions of the conductive layer, the insulating body being adjacent to the first and second portions of the conductive layer,
   forming first and second semiconductor devices in the semiconductor substrate on opposing sides of the trench; and
   forming a second trench in the semiconductor substrate, the second trench having first and second opposing inner walls and a floor and a second width that is less than the first width.

2. The method of claim 1, further comprising forming a third conductive plate within the second trench.

3. The method of claim 2, further comprising forming an insulating layer within the second trench having first and second portions over the opposing inner walls of the second trench and a third portion over the floor of the second trench such that there is a gap between the first and second portions of the insulating layer within the second trench, and wherein the formation of the third conductive plate comprises forming a conductive layer within the second trench, the conductive layer being within the gap and adjacent to the first, second, and third portions of the insulating layer within the second trench.

4. The method of claim 3, wherein the semiconductor substrate has a first dopant type, further comprising forming at least one buried layer within the semiconductor substrate having a second dopant type, the at least one buried layer being formed at a first depth from an upper surface of the semiconductor substrate, and wherein the first and second trenches have a second depth that is greater than the first depth and are adjacent to the at least one buried layer.

5. The method of claim 4, wherein the formations of the respective insulating layers within the trench and the second trench are performed simultaneously and the formations of the respective conductive layers within the trench and the second trench are performed simultaneously.

6. A method for constructing a microelectronic assembly comprising:
   forming a trench in a semiconductor substrate having a first dopant type, the trench having first and second opposing inner walls and a floor;
   forming an insulating layer within the trench, the insulating layer having first and second portions over the first and second opposing inner walls of the trench respectively and a third portion over the floor of the trench;
   forming a conductive layer within the trench over the insulating layer, the conductive layer having first, second, and third portions over the respective first, second, and third portions of the insulating layer, the conductive layer having a thickness such that a gap lies between the first and second portions thereof;
   removing the third portion of the conductive layer to separate the first and second portions of the conductive layer and form first and second conductive plates;
   forming an insulating body within the trench in the gap between the first and second portions of the conductive layer;
   forming first and second semiconductor devices on opposing sides the trench; and
   forming at least one buried layer having a second dopant type within the semiconductor substrate, the at least one buried layer being formed at a first depth from an upper surface of the semiconductor substrate,
   wherein the trench has a second depth that is greater than the first depth and is adjacent to the at least one buried layer.

7. The method of claim 6, wherein the trench has a first width and further comprising:
   forming a second trench in the semiconductor substrate and adjacent to the at least one buried layer, the second trench having first and second opposing inner walls and a floor and a second width that is less than the first width;
   forming an insulating layer within the second trench having first and second portions over the opposing inner walls of the second trench and a third portion over the floor of the second trench such that there is a gap between the first and second portions of the insulating layer within the second trench; and
   forming a conductive layer within the second trench, the second conductive layer being within the gap and adjacent to the first, second, and third portions of the insulating layer within the second trench to form a third conductive plate within the second trench.

8. The method of claim 7, wherein the formations of the respective insulating layers within the trench and the second trench are performed simultaneously and the formations of the respective conductive layers within the trench and the second trench are performed simultaneously.

9. The method of claim 8, wherein the first width is between approximately 2 and 4 microns, the second width is between approximately 1 and 2 microns, and the second depth is between approximately 6 and 12 microns.

10. A method for constructing a microelectronic assembly comprising:
    forming a trench in a semiconductor substrate;
    forming an insulating layer within the trench;
    forming first and second conductive plates within the trench; and
    forming first and second semiconductor devices in the semiconductor substrate on opposing sides of the trench,
    wherein the trench has first and second opposing inner walls and a floor and a first width, the insulating layer has first and second portions over the first and second opposing inner walls of the trench respectively and a third portion over the floor of the trench and the formation of the first and second conductive plates comprises:
       forming a conductive layer within the trench, the conductive layer having first and second portions over the first and second opposing inner walls of the trench and the first and second portions of the insulating layer respectively and a third portion over the floor of the trench and the third portion of the insulating layer, and
       removing the third portion of the conductive layer to separate the first and second portions of the conductive layer and form the first and second conductive plates,
    wherein there is a gap between the first and second portions of the conductive layer; and
    forming an insulating body within the trench in the gap between the first and second portions of the conductive layer, the insulating body being adjacent to the first and second portions of the conductive layer; and
    forming a second trench in the semiconductor substrate, the second trench having first and second opposing inner walls and a floor and a second width that is less than the first width.

11. The method of claim 10, further comprising:
    forming a third conductive plate within the second trench; and
    forming an insulating layer within the second trench having first and second portions over the opposing inner walls of the second trench and a third portion over the floor of the second trench such that there is a gap between the first and second portions of the insulating layer within the second trench,
    wherein the formation of the third conductive plate comprises forming a conductive layer within the second trench, the conductive layer being within the gap and adjacent to the first, second, and third portions of the insulating layer within the second trench.

12. The method of claim 11, wherein the semiconductor substrate has a first dopant type, further comprising forming at least one buried layer within the semiconductor substrate having a second dopant type, the at least one buried layer being formed at a first depth from an upper surface of the semiconductor substrate, and wherein the first and second trenches have a second depth that is greater than the first depth and are adjacent to the at least one buried layer.

* * * * *